United States Patent
White et al.

(10) Patent No.: US 6,577,923 B1
(45) Date of Patent: Jun. 10, 2003

(54) APPARATUS AND METHOD FOR ROBOTIC ALIGNMENT OF SUBSTRATES

(75) Inventors: John M. White, Hayward, CA (US); Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/470,821

(22) Filed: Dec. 23, 1999

(51) Int. Cl.[7] .............................................. G06F 19/00
(52) U.S. Cl. .................... 700/245; 700/57; 700/230; 700/254; 700/258; 118/715; 118/719; 118/724; 118/728; 118/729; 414/217; 414/280; 414/281; 701/23
(58) Field of Search .................... 700/245, 57, 254, 700/258, 230; 118/725, 728, 729, 719, 715, 724, 730; 414/416.03, 217, 280, 287, 935, 744.6; 901/15, 23; 204/298.25; 406/84; 701/23; 198/775, 860.4; 211/141.18

(56) References Cited

U.S. PATENT DOCUMENTS

| | | | | |
|---|---|---|---|---|
| 5,102,280 A | | 4/1992 | Poduje et al. | 414/225 |
| 5,224,809 A | * | 7/1993 | Maydan et al. | 264/297.2 |
| 6,069,096 A | * | 5/2000 | Nishihata et al. | 370/259 |
| 6,085,125 A | * | 7/2000 | Genov | 414/226.05 |
| 6,163,946 A | * | 12/2000 | Pryor | 703/23 |
| 6,176,668 B1 | * | 1/2001 | Kurita et al. | 711/112 |
| 6,213,704 B1 | * | 4/2001 | White et al. | 706/10 |
| 6,235,634 B1 | * | 5/2001 | White et al. | 382/209 |
| 6,242,879 B1 | * | 6/2001 | Sagues et al. | 318/567 |
| 6,286,688 B1 | * | 9/2001 | Mimken et al. | 206/454 |
| 6,314,631 B1 | * | 11/2001 | Pryor | 29/407.04 |

FOREIGN PATENT DOCUMENTS

| | | | | |
|---|---|---|---|---|
| JP | 10-173022 | 6/1998 | | H01L/21/68 |
| JP | 10-303269 | 11/1998 | | H01L/21/68 |
| JP | 10-335410 | 12/1998 | | H01L/21/68 |
| JP | 11-139559 | 5/1999 | | B65G/49/07 |
| JP | 11-297790 | 10/1999 | | H01L/21/68 |
| JP | 02001244316 A | * | 9/2001 | |
| WO | WO 92/05920 | 4/1992 | | B25J/9/06 |
| WO | WO 99/02996 | 1/1999 | | |
| WO | WO 99/42256 | 8/1999 | | B25J/9/10 |
| WO | WO 99/59056 | 11/1999 | | G06F/7/00 |
| WO | WO 99/64207 | 12/1999 | | B25J/9/10 |

OTHER PUBLICATIONS

Penunuri et al., Single–phase, Unidirectional transducer design for charge transport devices, 1990, IEEE, pp. 237–242.*
Porter et al., High density substrates and packaging, 1999, IEEE, pp. 197–201.*
Dixon et al., Mobile robot navigation, 1997, Imperial College, London/Internet, pp. 1–29.*
Australian Search Report from Application No. SG 200007529–1, Dated Jun. 5, 2002.

* cited by examiner

Primary Examiner—William A. Cuchlinski, Jr.
Assistant Examiner—McDieunel Marc
(74) Attorney, Agent, or Firm—Moser, Patterson & Sheridan LLP

(57) ABSTRACT

A robot device that either translationally or rotationally aligns an object with a slot. For translational alignment, the robot device comprises a position sensor positioned in close proximity to the slot. The translational position sensor determines the position of the object by moving the object parallel to the slot until it actuates the position sensor. For rotational alignment, two position sensors are provided that determine the relative angle between the object and a portion of the robot device and the object.

35 Claims, 10 Drawing Sheets

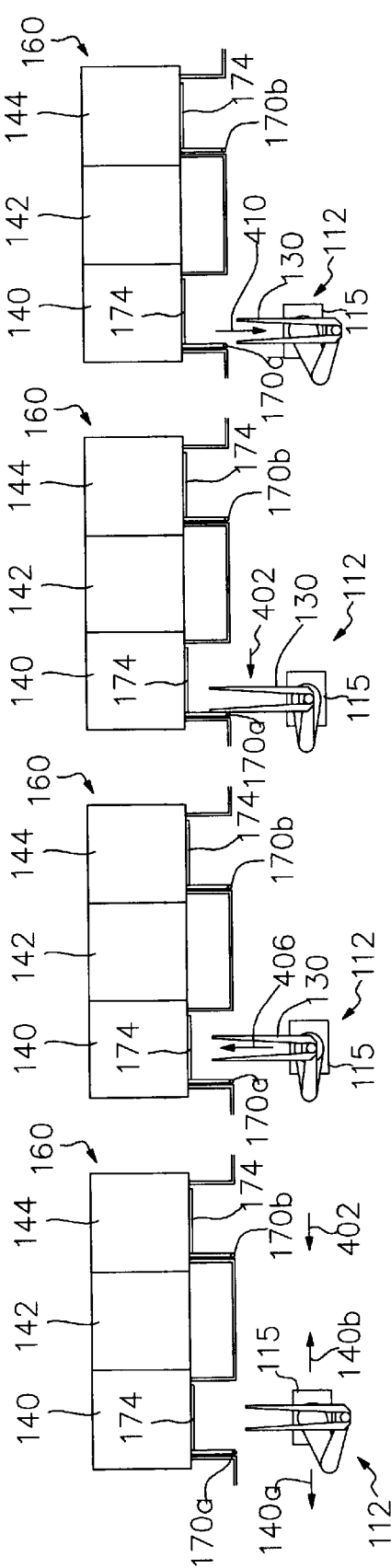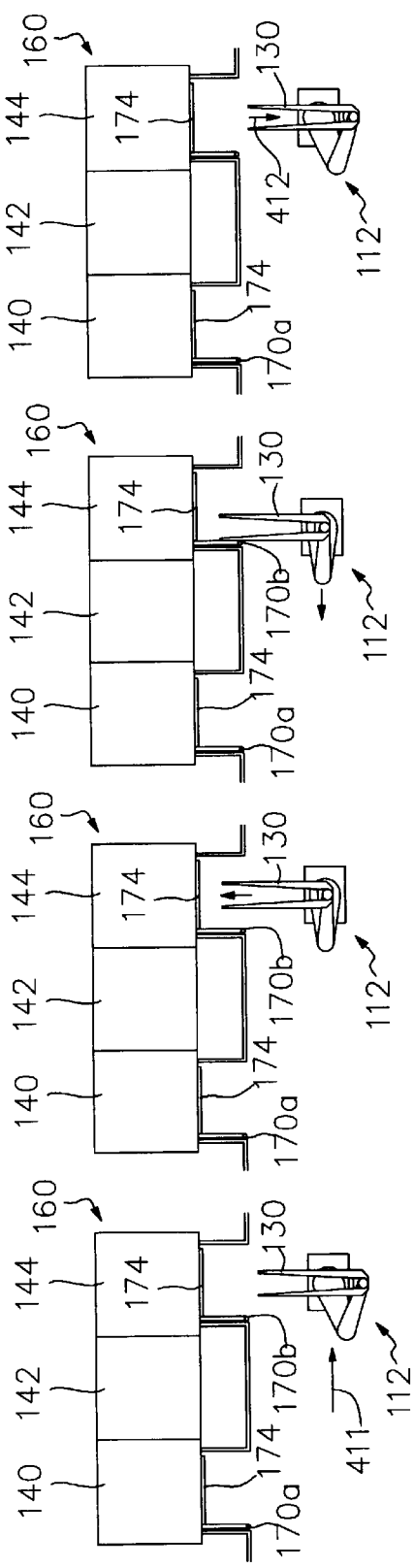

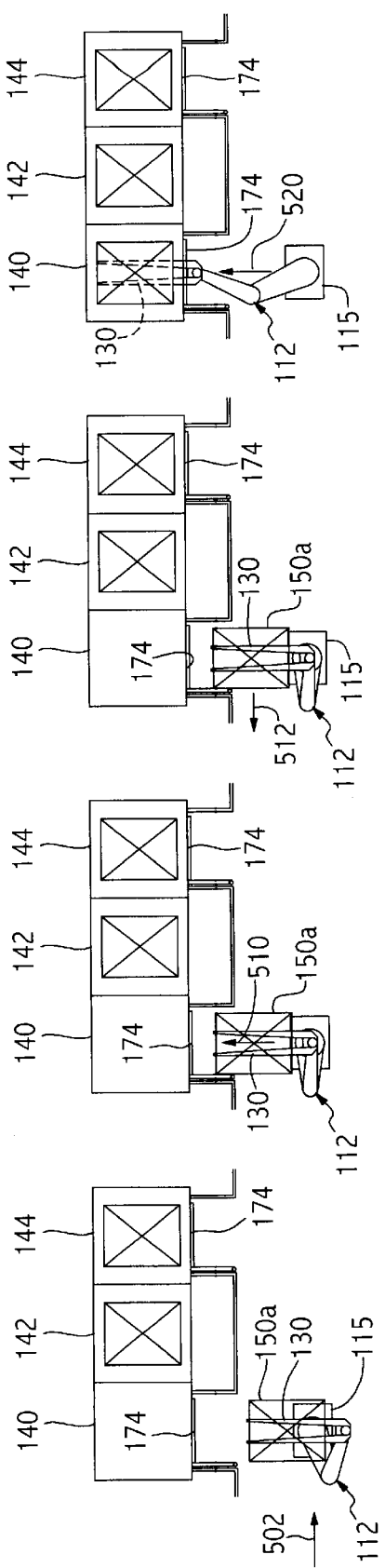
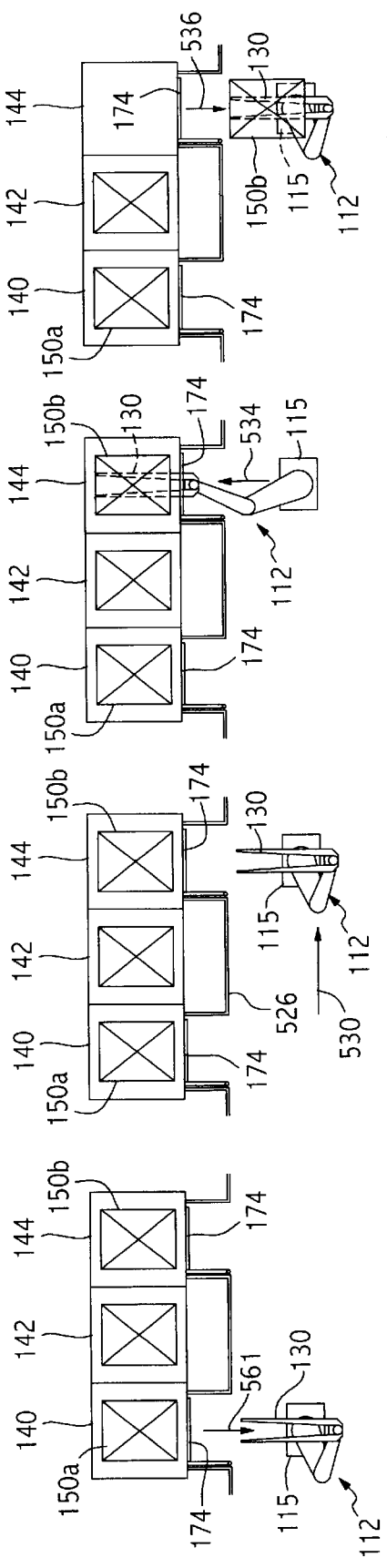

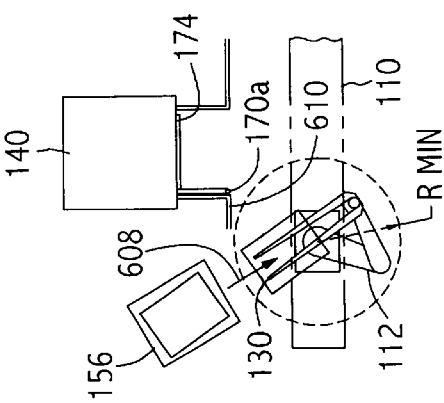
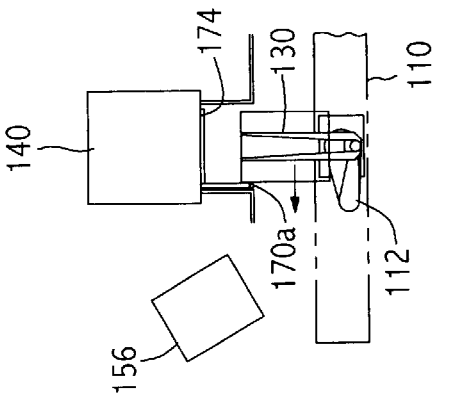
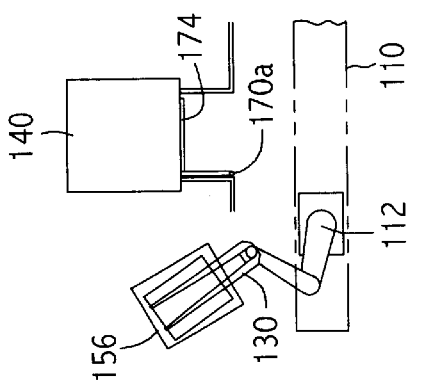
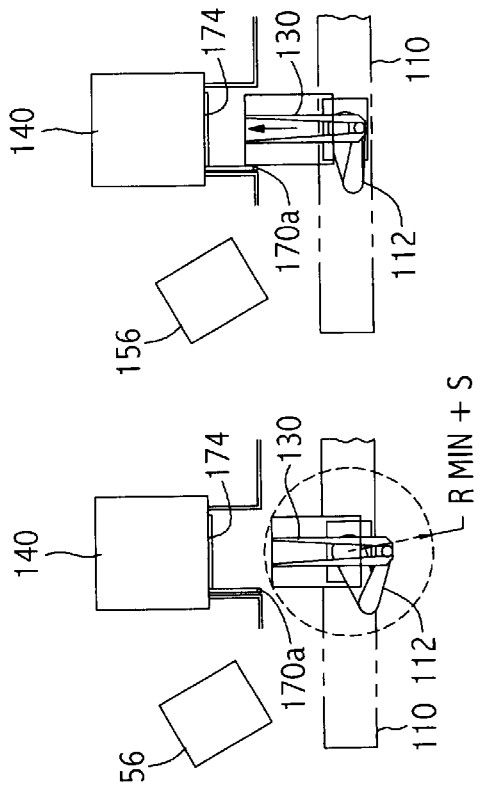
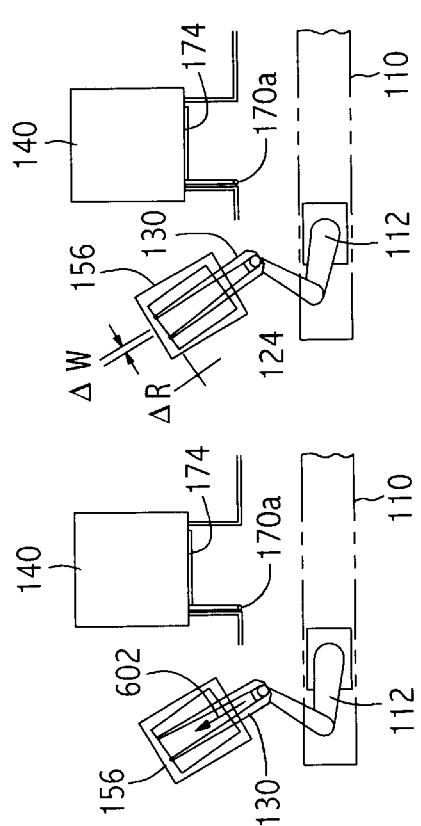
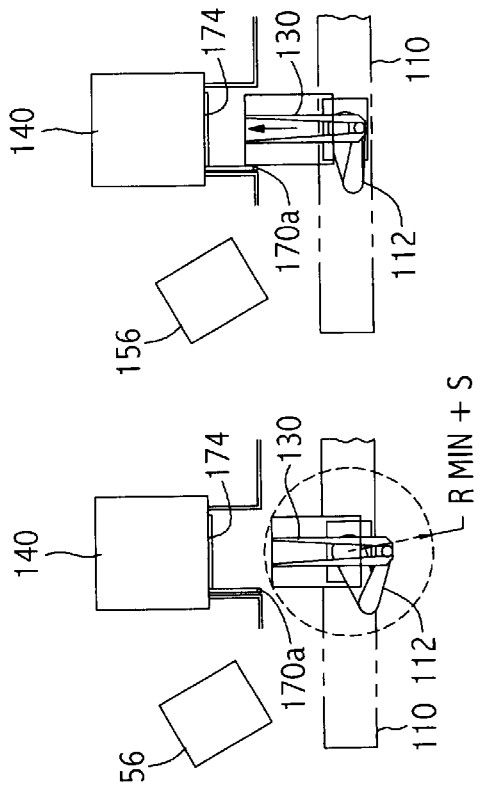

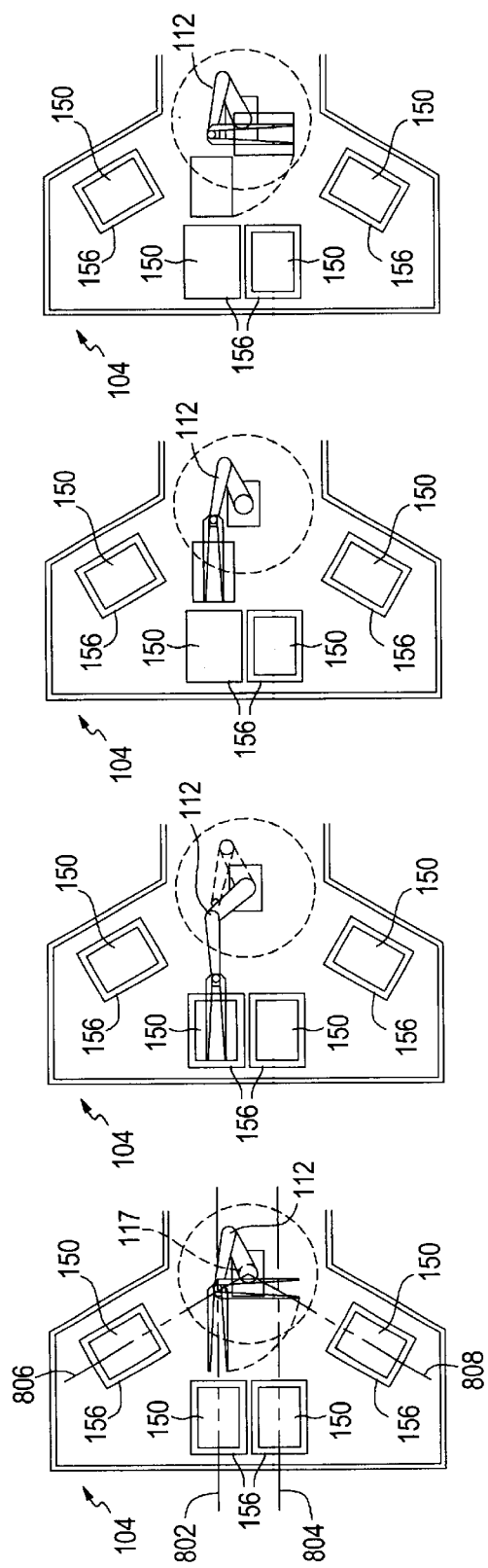

APPARATUS AND METHOD FOR ROBOTIC ALIGNMENT OF SUBSTRATES

BACKGROUND OF THE DISCLOSURE

1. Field of the Invention

The invention relates to robots. More particularly, the invention relates to robotic alignment of objects (or openings in the objects) that may displace over time.

2. Description of the Prior Art

Processing of substrates is an integral part of producing integrated circuits and is generally known in semiconductor wafer technology. Wafers, which are one form of substrate, are typically five to eight inches in diameter. A single wafer can be exposed to a number of sequential processing steps including, but not limited to, chemical vapor deposition (CVD), physical vapor deposition (PVD), etching, planarization, and ion implantation. Two important goals of all semiconductor processing are to keep the substrates as clean from impurities as possible while enhancing throughput of substrates through many process chambers.

End effectors or robot blades are the portions of the robot that directly supports the substrate. Robots are often used to transfer a substrate from a cassette to an entrance load lock. The same or a different robot(s) is then used to transfer the substrates from that entrance load lock into one or more process chambers, then into an exit load lock. Finally the same or a different robot(s) moves the substrate from the exit load lock into the cassette once again.

The use of robots with end effectors is very desirable in these applications because robots do not contaminate the substrate (if designed properly). Robots can process a large number of substrates through many different processing technologies, and robots can perform repetitive tasks very accurately. Human handling of a substrate, by comparison, lead to contamination of the substrate. As the trend to miniaturize integrated circuits continues (as a result of connections, lines, and vias becoming smaller or thinner), the potential effect of any such impurities becomes more damaging. Thus, the use of robots with end effectors is becoming more essential for transporting substrates in this highly competitive semiconductor field.

Robots with end effectors can also process different substrates from wafers. For example, flat-panel displays formed from non-wafer substrates are getting larger (60 inches and larger). Flat panel displays are capable of providing excellent images and are becoming more accepted, but require a wide and complex variety of substrate processing steps. Considering the electronic complexity and expense of processing flat-panel displays, the benefits of keeping them free from impurities are obvious. A particular difficulty arises when robots are used to transfer large or irregularly shaped substrates or flat-panel displays between load-locks and process chambers. It is difficult to ensure that flat-panel displays align properly with the end effectors of the robots and that once aligned, the substrate can pass through slots or other obstacles in the load locks or process chambers without collisions. A collision may not only chip the flat-panel display, but also create and deposit debris in either the load lock or process chamber. Such debris may result in significant damage to plat-panel displays, including those not directly involved with the collision.

Certain process chambers and load locks operate at high temperatures while others run at much lower temperatures, including room temperature. The temperature variations between the different load locks and process chambers lead to relative thermal expansion or contraction. As a result of thermal expansion, the robot device has difficulty determining the precise position of the load locks and process chambers. Additionally, certain large flat-panel displays can expand thermally by 5 mm during normal processing. Compare this value to the desired substrate transferring accuracy of 1 mm, and the robot may be uncertain of the exact location of the load lock. As the substrate itself undergoes expansion or contraction, the dimensions of overhang of the substrate over the end effector of the robot become variable. It would be desirable to provide a system by which a robot could compensate for the thermal expansion of the substrate.

Another difficulty with the robotic alignment of substrates occurs as a result of carrying the substrate in a cassette. There is typically 10–15 mm of play between the substrates and the cassettes, depending upon the physical configuration of both, i.e. each substrate is not uniformly positioned within its respective cassette. Therefore, even if the robot knows the precise location of the cassette, it may be uncertain of the exact location of the substrate within the cassette. One prior art configuration that attempts to align a substrate within a cassette is known as a "Kachanger" clamp, which precisely and securely clamps the substrate within a cassette. A disadvantage of this device is that the clamp can abrade the substrate, leading to production of particles. As described previously, particles are highly undesirable in the "clean" environment associated with the production of substrates. Mechanical clamps can also deform with pressure or wear over time such that the substrate would not be precisely located in a perceived position within the cassette.

Therefore, a need exists for a device that can align an end effector of a robot device with a substrate in a processing apparatus.

SUMMARY OF THE INVENTION

The invention provides an apparatus and associated method for aligning a substrate using a robotic device. The invention is embodied in a robot device that in alternate embodiments translationally or rotationally aligns an object with a slot. For embodiments providing translational alignment, the robot device comprises a position sensor positioned adjacent to the slot. The translational position sensor determines the position of the object by moving the object relative to the slot until it actuates the position sensor. For embodiments providing for rotational alignment, two position sensors are provided that determine the relative angle between the object and a portion of the robot device and the object.

BRIEF DESCRIPTION OF THE DRAWINGS

The teachings of the present invention can be readily understood by considering the following detailed description in conjunction with the accompanying drawings, in which:

FIG. 4, comprising FIGS. 4A to 4H, shows a top schematic diagram of one embodiment of a progression of a top view of robot motion in which the robot device translationally aligns an end effector with multiple load locks;

FIG. 5, comprising FIGS. 5A to 5H, shows a top schematic diagram of one embodiment of a progression of a top view of robot motion in which the robot device loads one substrate into one load lock, then unloads another substrate from another load lock;

FIG. 6, comprising FIGS. 6A to 6H, shows a top schematic diagram of one embodiment of a progression of a top view of robot motion in which the robot device removes a substrate from a cassette and then rotationally aligns the substrate to insert it into a load lock;

FIG. 7, comprising

FIG. 8, comprising FIGS. 8A to 8H, shows a top schematic diagram of one embodiment of cassette loading portion of FIG. 1 depicting the loading of wafers from a variety of positions;

To facilitate understanding, identical reference numerals have been used, where possible, to designate identical elements that are common to the figures.

DETAILED DESCRIPTION

After considering the following description, those skilled in the art will clearly realize that the teachings of the invention can be readily utilized in robot assemblies of any type that require high precision in processing substrates. The substrates in this disclosure include, but are not limited to, integrated circuits and flat-panel displays.

System Structure

Figure 1:
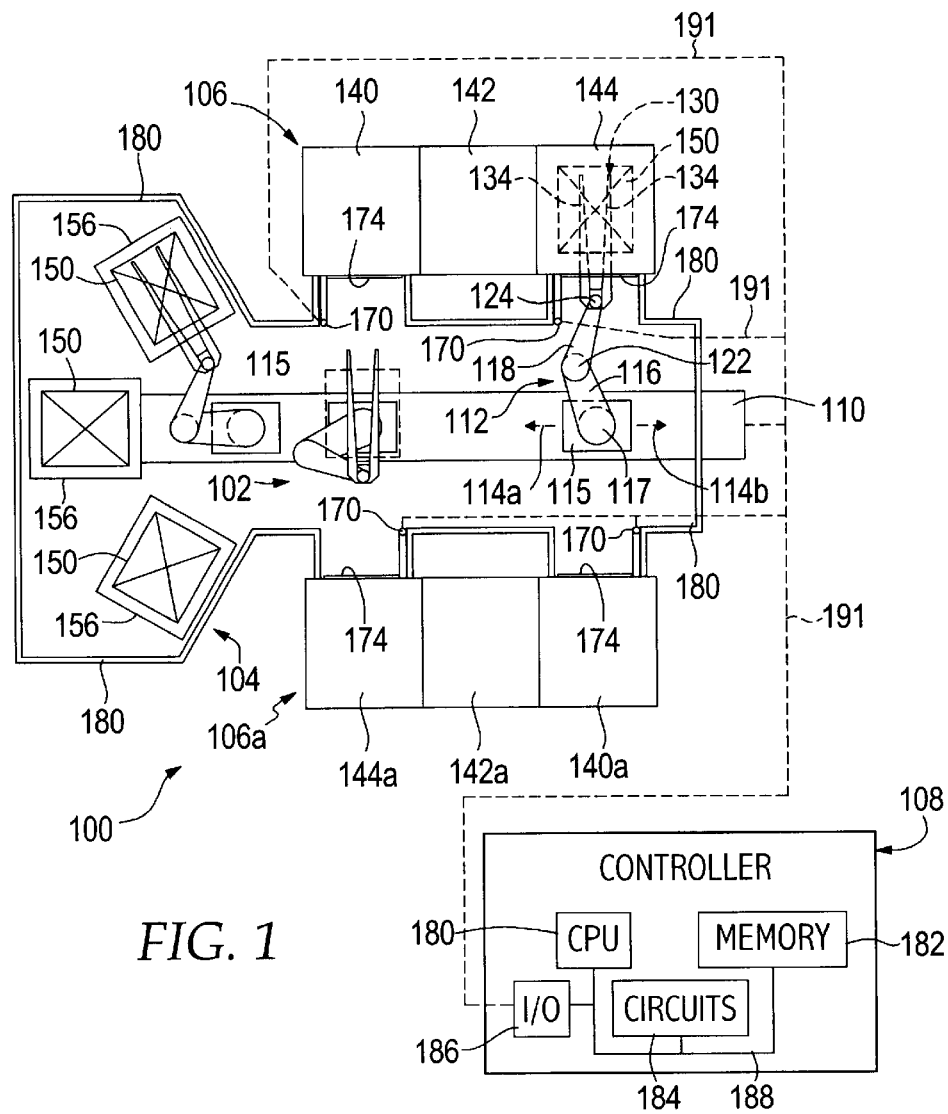
FIG. 1 shows a top schematic view of one embodiment of an automated substrate processing apparatus including a robot device displacing end effector, the robot device is depicted in several positions interacting with the substrate.

FIG. 1 discloses an automated substrate processing apparatus 100 of one embodiment of the present invention. The automated substrate processing apparatus comprises robot portion 102, cassette loading portion 104, substrate processing portions 106, 106a, and controller 108. A base 115 of the robot portion 102 follows a robot travel path 110. The robot device 112 is depicted in three positions in FIG. 1, even though there is, in actuality, only one robot device. The robot device 112 moves under the control of controller 108, as described below. The robot device 112 includes the base 115, a first arm 116, a second arm 118, and an end effector 130. The base 115 is rotatably connected to the first arm 116 by rotational joint 117. The first arm 116 is rotatably connected to the second arm 118 by rotational joint 122. The end effector 130 is rotatably connected to the second arm 118 by rotational joint 124.

Each rotational joint 117, 122, and 124 is individually movable as controlled by controller 108, providing for a large range of motion by robot device as described below. Rotational joint 124 provides "wrist" motion of the end effector 130 relative to the robot portion 112 such that the end effector 130 can rotate relative to the remainder of the robot portion. Depending upon the configuration of a substrate 150, any type of known end effector 130 may be substituted for the end effector described herein. In this disclosure, the term "end effector" is intended to cover any portion of a robot that is configured to directly support a substrate, including but not limited to robot blades.

The base 115 can travel longitudinally as indicated by arrows 114a, 114b to move robot device 112. Rotational joint 117 includes a telescoping or elevator portion (not shown) that provides vertical motion of the robot device 112. The telescoping portion may be used to move end effector 130 vertically into contact with, or out of contact from, substrate 150. Such vertical motion associated with rotational joint 117 might also be used to access multiple substrates 150 stored in multiple cassettes 156 stacked at different heights.

Figure 2:
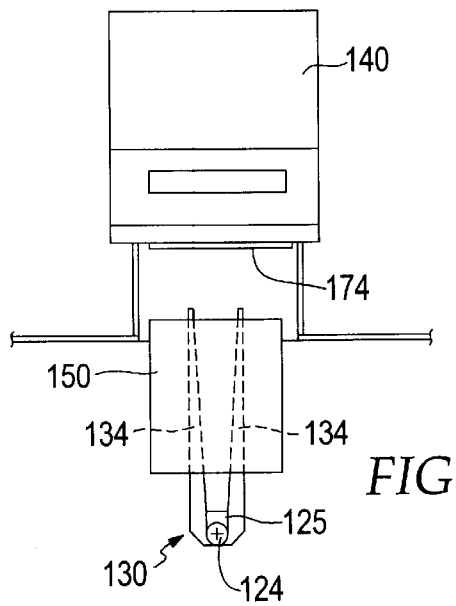
FIG. 2 shows a top view of the end effector of FIG. 1 carrying a substrate.

The end effector 130 is shown in greater detail in FIG. 2. The end effector 130 includes a rear support 125 and multiple elongated supports 134. The rear support 125 provides support for the elongated supports 134 to hold substrate 150. The rear support 125 also includes part of rotational joint 124. The elongated supports 134 must be light, yet structurally capable of supporting the weight of the substrate 150 without excessive deformation. The elongated supports 134 preferably are also "textured" or formed from some material that limits slippage between the substrate and the elongated support during robotic motion. Relative linkage motion of first arm 116, second arm 118, and end effector 130 about rotational joints 117, 122, and 124 can provide for transverse motion of the end effector 130 relative to longitudinal robot travel path, as well as rotational motion of the end effector.

Controller 108 controls longitudinal, transverse, rotational, and elevational movement of end effector 130. While one embodiment of robot device 112 is depicted in FIG. 1, this embodiment is illustrative in nature and not intended to be limiting in scope. Robots are configured to provide specific rotational, longitudinal, translational, or elevational motion, or some combination thereof.

In the upper portion of FIG. 1, the substrate processing portion 106 includes a load lock 140, a process chamber 142, and a load lock 144. Along the lower portion of FIG. 1, another substrate processing portion 106a includes a load lock 140a, a process chamber 142a, and a load lock 144a. The substrate processing portion 106a, along with its components may operate in a similar manner as the substrate processing portion 106, and is provided for increased throughput. Alternatively, the substrate processing portions 106 and 106a can include different, but complementary, operations. For example, one substrate processing portion 106 may perform PVD, etch, CVD, a combination thereof, or other known processing operation while substrate processing portion 106a performs other(s) of such operations. For brevity, all further description will relate to the substrate processing portion 106 and its components.

Both load locks 140 and 144 are configured to provide entry of a substrate 150 into, or out of, the substrate processing portion 106 while maintaining a desired temperature and pressure within the substrate processing portion 106. Though one load lock may be referred to in the art as a "hot" load lock and another one is disclosed as a "cold" load lock in the art, the temperatures of any particular load lock may vary considerably during operation. The load locks are typically calibrated when both load locks are cold, such that thermal expansion results in displacement of one (or both) load lock 140, 144 relative to the other. The thermal expansion of process chamber 142 and load locks 140 or 144 each contribute to relative movement of slots 174 relative to robot device 10. Additionally, the substrate 150 itself may thermally expand due to changes in temperature during, e.g., processing. Finally, the substrate 150 may move relative to the end effector 130. The present invention provides for and relates to correction of misalignment between the substrate 150 or the end effector 130 relative to the slots 174 (or other object) formed in the load locks 140 or 142.

Slot 174 (see FIG. 3), with a width W and a height H, formed in load locks 140 or 144 provide an entry and/or exit for substrate 150 (and the supporting end effector 130). There is typically a conveyor system or another robot system, not shown, that conveys substrates between the different load locks 140 and 144 of the substrate processing portion 106.

Recently, the size of certain flat-panel displays has become very large compared to other prior substrates (60 inches, or even more). It is desirable to minimize the size of the load locks 140, 144 and the process chamber 142 since it is difficult and expensive to build extremely large process chambers and load locks capable of maintaining the necessary temperatures and pressures to perform many process operations on these larger substrates. If the size of the substrate 150 is quite large, and the internal size of the load locks 140, 144 and the process chamber 142 is relatively small, then the clearance between the sides of the substrate 150 and the load locks 140, 144 (or the process chamber 142) becomes quite small. This small clearance requires that care be exercised in moving the substrate 150 into and around the substrate processing portion 106 to limit collisions therebetween.

If substrate 150 touches a portion of a process chamber or load lock, it might result in very expensive, or even catastrophic, damage to either the load lock, the process chamber 142 or the substrate 150. First, the substrate itself is expensive with the more expensive substrates costing tens of thousands of dollars. An undesirable collision with the process chamber might chip the substrate and reduce its value or make it worthless. Additionally, residual particles or debris from the substrate might remain in the substrate processing portion 106 which might seriously degrade the purity of further processing, or may damage the substrate processing portion 106 itself. While the present disclosure relates to aligning a substrate to an opening in a load lock, it is envisioned that the invention also applies to aligning a substrate to an opening in a process chamber or aligning a substrate to any object which robot device has to maneuver around.

The cassette loading portion 104 depicted in FIG. 1 includes three cassettes 156 that are configured to carry substrates outside of and between different automated substrate processing apparatus 100. The cassettes 156 are configured such that the end effector 130 can fit within the cassette to insert or retract the substrate from within the cassette. The cassette loading portion 104, as well as the remainder of the automated substrate processing apparatus 100, is typically air tight to limit impurities being applied to the substrates 150. The cassettes contained in the cassette loading portion 104 may be all loaded on a single horizontal level, or alternately multiple cassettes may be stacked on top of each other. In the latter configuration, the robot device 112 must be configured to provide vertical movement to retrieve substrates at different levels. One embodiment to accomplish this is to provide a telescoping or telescoping portion in rotational joint, 117, as described above.

FIG. 8 shows the progression of robot motion used by robot device 112 to access substrates 150 located in cassettes 156. Cassettes 156 are positioned about robot loading portion 104 in a variety of positions. In FIG. 8A, the axes 802, 804 of two substrates 150 do not pass through rotational joint 117 which represents the joint that the entire robot device 112 can rotate about. Axes 806 and 808 of two other substrates 156 are aligned with rotational joint 117. FIGS. 8A to 8H indicate the motion robot device 112 goes through to obtain substrates 150 located in cassettes 156 that are either aligned, or offset from, the rotational joint 117 of the robot. By comparison, prior art robot devices are able to retrieve substrates only aligned with the robot pivot, or not-aligned with the robot pivot.

There are two position sensors described in this disclosure. The first position sensor, called a translational positional sensor 170 (in FIG. 1) only senses the position in a lateral direction (114a and 114b—FIG. 1) of the substrate 150, or the end effector 130 relative to slot 174 formed in load lock 140 or load lock 144. The second position sensor (shown as 1406a and 1406b in FIG. 9 and 1502 in FIG. 14—described below) is called a rotational position sensor. The rotational position sensor is used to sense the angle of substrate 150 relative to end effector 103. The rotation position sensor is also referred to as an angle determining device.

Figure 3:
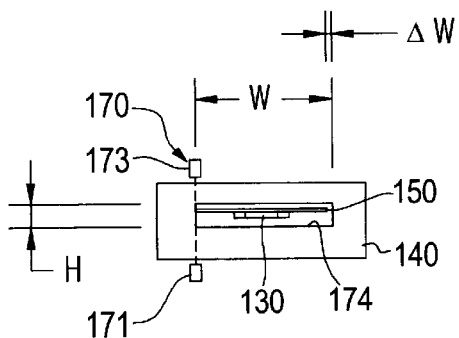
FIG. 3 shows a front elevational view of a load lock of FIG. 2 having an end effector positioned in close proximity.

The translational position sensor 170 (FIG. 3) is attached above, and to the left of, slot 174. Though the translational position sensor 170 and slot 174 is depicted relative to one specific load lock 140, all other load locks 144, 144a, 144b in FIG. 1 have similar translational position sensors 170. The translational position sensor 170 in FIG. 1 includes a vertically directed beam extending between beam transmitter 171 and beam receiver 173 (see FIG. 3) that are aligned with the left side of slot 174 in FIG. 1. In this configuration, when end effector 130 moves to the left a sufficient distance to break the beam, the translational position sensor indicates that the left side of the end effector 130 is aligned with the left side of slot 174. As shown in FIG. 3, when the end effector 130 breaks the beam of translational position sensor 170, the right side of end effector 130 is spaced a distance ΔW from the right edge of slot 174. Therefore, if it is desired to center the end effector 130 with the slot, the robot blade 130 is then moved to the right a distance of ΔW/2.

In the configuration shown in FIG. 3, the translational position sensor 170 determines the position of the end effector 130 by having the left-most portion of the end effector 130 break the beam of the translational position sensor 170. Alternatively, the translational position sensor can be positioned such that some other part of the robot device 112 (or some other part of the substrate 150 carried by the end effector 130) breaks the beam of the translational position sensor 170. However, assuming that the translational position sensor is directed at some portion of the robot device 112 or the substrate 150 that is not the left-most extending portion of the end effector 130, then the translational position sensor 170 has to compensate for the overlap from the portion that broke the beam relative to the end effector 130. In this manner, the translational position sensor 170 must consider the overall configuration of the end effector 130, the substrate 150, and their actual position relative to the slot 174.

Controller 108 comprises central processing unit (CPU) 180, memory 182, circuits portion 184, input/output interfaces (I/O) 186, and system bus 188. The controller 108 controls operation of the robot portion 102 and the process chambers 142, 142a by receiving input from the translational position sensors 170 and user input from circuits 184 and memory 182. The CPU performs the processing and arithmetic operations for the controller. CPU 180 is preferably of a type produced by Intel, Texas Instruments, AMD, or other such companies and whose operations is generally known to those skilled in the art. The memory 182 includes random access memory (RAM) and read only memory (ROM) that together store the computer programs, operands, operators, robot dimensional values, system processing temperatures and configurations, stored object configuration (describing the general outline of the object) and other necessary parameters for controlling the operation of the automated substrate processing apparatus 100. The system bus 188 provides for digital information transmissions between CPU 180, circuit portion 184, memory 182, and I/O 186. A second bus 191 connects I/O 186 to the portions of the automated substrate processing apparatus 100 that either receive digital information from, or transmit digital information to, controller 108.

I/O 186 provides an interface to control the transmissions of digital information between each of the components in controller 108. I/O 186 also provides an interface between the components of the controller 108 and different portions of the automated substrate processing apparatus. Various sensors, such as temperature and pressure sensor of process chamber 142, position sensors of the robot device 112, and rotational position sensor located on end effectors 130 (and described below relative to FIGS. 9 and 14) transmit their outputs to I/O 186 such that controller 108 can process and display this output. Circuit portion 184 comprises all of the other user interface devices (such as display and keyboard), system devices, and other accessory devices associated with the controller 108. It is noted that while one embodiment of digital controller 108 is described herein, other digital controllers as well as analog controllers could function well in this application, and are within the intended scope of the present invention.

Formed about the periphery of the automated substrate processing apparatus 100 is enclosure 180 configured to enclose the robot and process chamber equipment, and maintain the substrates 150 free from debris and contaminants. The enclosure has accessible ports (not shown) which are situated to insert cassettes 156 into cassette loading portion 104, inspect and repair the substrate processing portion 106 or 106a and/or the robot device 112.

Robot Motion and Related Computer Programs

This segment of the disclosure relates to four types of robot motion produced by the robot device 112 and the associated computer programs that produce the four types of robot motion. The first type of robot motion, shown in FIG. 4, relates to aligning end effector 130 with the slot 174 formed in load lock 140 of FIG. 3. This type of robot motion is also integrated in each of the last three types of robot motion shown in FIGS. 5–7. The second robot motion, shown in FIG. 5, relates to inserting or removing a substrate through the slot 174 formed in load locks 140, 144. The third and the fourth robot motion, shown respectively in FIGS. 6 and 7, relate to determining an angle of a substrate relative to the end effector 130, then rotationally aligning the substrate 150 with the slot 174 so that the substrate can be inserted through the slot 174. FIGS. 10 to 13 depict flow charts depicting computer logic associated with each robot motion depicted in FIGS. 4 to 8, respectively.

To accomplish the above four motions, the robot device 112 can be displaced in several directions. The first displacement occurs when the end effector 130 is rotated (through a full 360 degree range) about wrist joint or rotational joint 124 relative to the remainder of the robot device 112.

A second type of displacement occurs when base 115 "translates" along travel path 110 shown in FIG. 1, which may be linear or curvilinear, and extends adjacent to one or more slots 174 and cassette loading portions 104. A third type of displacement occurs when first arm 116 and the second arm 118 rotate relative to each other and base 15 about rotational joints 117 and 122. This third type of displacement can provide displacement of the end effector 130 toward and away from the base 115. The second and third type of displacement may together be considered to be "translational" displacement. Each of these rotational and translational types of displacement may be accomplished simultaneously with other types of displacements.

Translational position sensors 170, 170a, or 170b sense the translational position of end effectors 130 or substrates by, in one embodiment, projecting a beam that may be broken by end effector 130 or substrate 150. Alternatively, any portion of the robot device, or anything that moves relative to the robot device, substrate, or end effector indicating the position the elements may be used. The robot device 112 may carry substrates during certain robot motions, and not during other robot motions (with the stored object configuration of the substrate, the end effector, and the dimensions of first arm 116 and second arm 118 in robot device 117 being stored in memory 182). Depending upon the robot motion being performed, CPU 180 can determine whether end effector 130 is carrying substrate 150. Therefore, the specific translational position sensor 170, 170a, or 170b will sense either a portion of end effector 130 or substrate 150 depending upon the type of robot motion being performed. For ease of description, the motion of the end effector 130 is taken relative to either the left side of the left end effector 130. The motion of the substrate 150 is taken relative to the left edge of the substrate as depicted in FIGS. 4 to 8, even though other configurations are within the intended scope of the present invention.

As shown in FIG. 3, translational position sensor 170 actually includes a beam transmitter 171 and a beam receiver 173 with a beam extending between. The beam in this embodiment is aligned with slot 174. The translational position sensor may be an infrared sensor, a laser micrometer sensor, a visible light sensor, or any type of position sensor that is known today. Non-beam position or proximity sensors may also be used in this application. FIGS. 4A to 4D depict the robot motion associated with aligning end effector 130 with slot 174 formed in a lock load 140 using a translational position sensor 170a. FIGS. 4E to 4H depict the robot motion associated with aligning the end effector 130 relative to slot 174 formed in a load lock 144 using a translational position sensor 170b.

Figure 10:
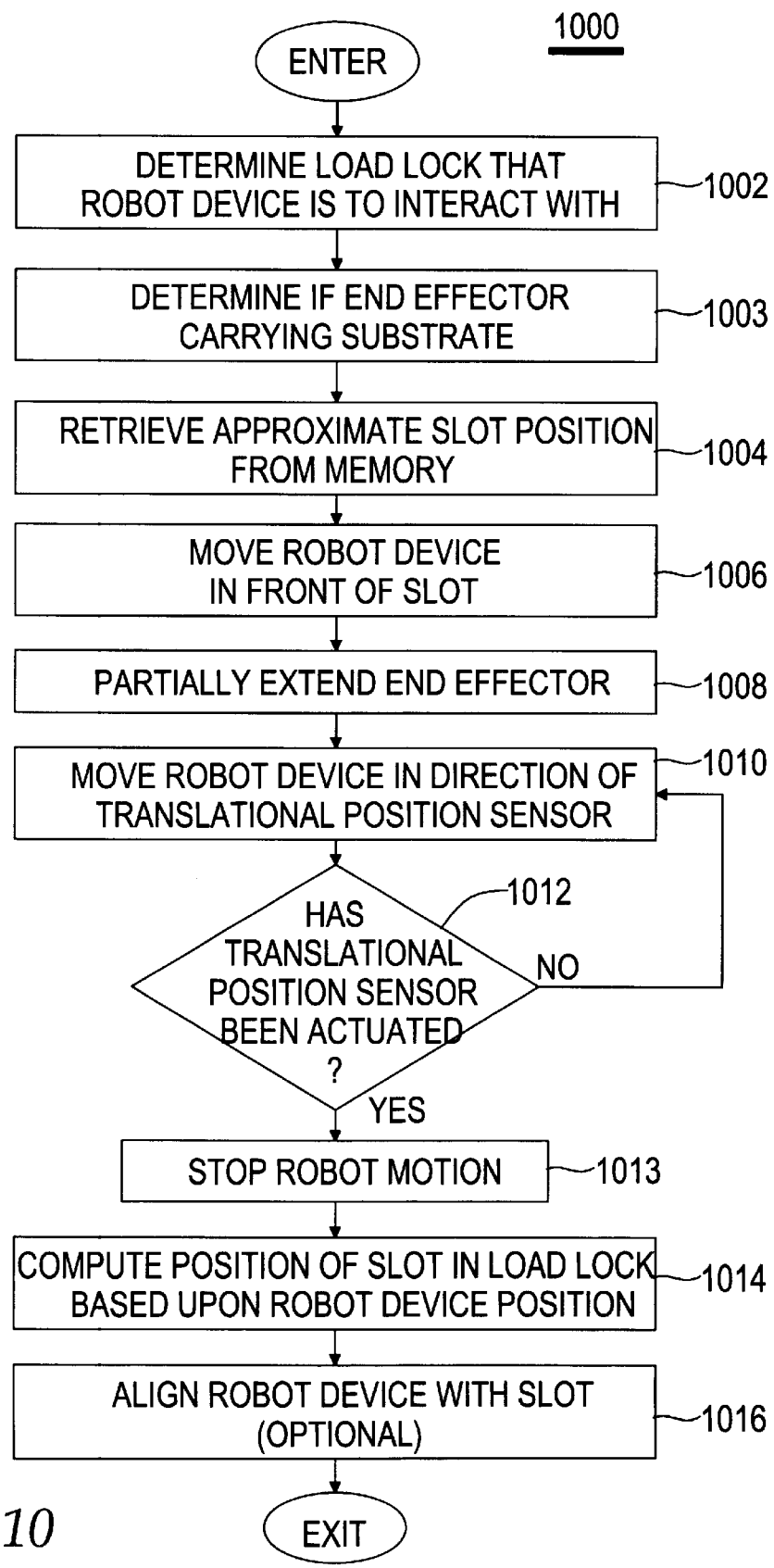
FIG. 10 shows computer software associated with the FIG. 4 robot motion progression of one embodiment of the present invention.

In FIG. 4A, base 115 follows robot travel path 110, shown in FIG. 1, along directions indicated by arrows 114a or 114b to be positioned in front of the slot 174. FIG. 10 shows one embodiment of computer software 1000 capable of performing the FIG. 4 alignment progression. Step 1002 determines the position of the load locks 140, 144, 140a, 144a having slot 174 with which it is desired to align the end effector 130. The controller 108 also determines if the robot device 112 is carrying a substrate 150. If the robot device is carrying a substrate, the dimensions of the substrate that would break translational position sensor 170 is different than if no substrate is used, and the extra dimension of the substrate has to be accounted for and accessed from memory 182. Computer software 1000 continues to step 1004, in which the approximate position of the slot 174 of the desired load lock 140, 144, 140a, 144a is determined. Each of the values in this paragraph is typically stored in memory 182 of controller, though a user could also input the appropriate values from an input device included in circuit portion 184.

In step 1006, which corresponds to FIG. 4A, the base 115 of robot device 112 is displaced along robot travel path 110 until the robot device is positioned in front of the approximate slot position in the load lock. The exact slot position is not known due to thermal expansion of the substrate processing portion 106. The remaining steps in computer program 1000 translationally align the end effector 130 or substrate 150 with slot 174 in load lock. The position of slot 174 is stored in memory 182 contained in controller 108, and is not calibrated to compensate for thermal expansion.

In step 1008, which corresponds to FIG. 4B, the controller 108 causes robot device 112 to partially extend end effector 130 sufficiently in the direction indicated by arrow 406, so that when the end effector 130 extends to the left in FIG. 4B over the translational position sensor 170a, the translational position sensor will be actuated. In FIG. 4C, base 115 gradually displaces the blade assembly 120 to the left as indicated by arrow 402 until the left elongated support 134 breaks the beam of translational position sensor 170a. Steps 1010 and 1012 which correspond to FIG. 4C act as a loop in which the robot device 112 is continually displaced to the left in FIG. 4C by end effector 130 until the end effector 130 breaks the beam of translational position sensor 170a. This motion to the left may be accomplished, using the embodiment of FIG. 1 of robot device 112, by displacing the base 115 of robot device 112 to the left along robot travel path 110 (see FIG. 1). As soon as the translational position sensor 170a is actuated, the robot motion to the left in step 1010 is halted in step 1013, and the computer program 1000 continues to step 1014. The controller derives the actual position of the translational position sensor 170 relative to the position of end effectors 130 in step 1014 using geometry by knowing the dimension of the first arm 116, the second arm 118, the end effector 130, and the relative angles between the joined members. The translational position sensor 170a is connected to the load lock 140 (and the slot 174 formed therein) in a manner that when the load lock moves to the left in FIG. 4A due to thermal expansion, the translational position sensor 170 is similarly displaced along a direction indicated by arrow 402 (i.e. the position of the translational position sensor 170a is physically coupled to the position of slot 174 formed in load lock 140). Since the controller also has stored in memory 182 the relative position of the slot 174a relative to the translational position sensor 170a, the CPU 180 can compute the actual position of the slot 174.

In FIG. 4D, the robot device 112 retracts the blade assembly 120 in a direction indicated by arrow 410 a sufficient distance so that the blade assembly can be moved to the right in FIG. 4D without contacting wall 412. In FIG. 4E, the base 115 of the robot device 112 is moved a suitable distance to the right along direction indicated by arrow 411 to roughly align robot device 112 with slot 174 in load lock 144 as determined by controller 108, the position of which is not exactly known due to thermal expansion.

In step 1016, which is optional in certain applications of the computer software 1000, the robot device 112 moves the end effector 130 to the right a sufficient distance to align the latter (and substrate 150 if one is being carried) with the slot 174. This alignment can be performed by centering the end effector 130 relative to the slot 174, or simply by providing sufficient clearance between one end of the end effector 130 or substrate 150 so that both lateral sides of the end effector or substrate clear the lateral sides of the slot 174 when the former are moved through the latter.

FIGS. 4F, 4G, and 4H follow a similar routine as described above relative to FIGS. 4B to 4D to determine the location of slot 174 formed in load lock 144 using translational position sensor 170b. The FIG. 10 computer software 1000, described above, is also used to align the end effector 130 with the slot 174 formed in the load lock 144.

FIGS. 5A to 5E depict the process associated with inserting a substrate through a slot 174 formed in load lock 140. FIGS. 5F to 5H depict the process associated with removing a substrate from a load lock 144 via slot 174. FIGS. 1–3, 5, and 11 should all be considered relative to the second type of robot motion.

FIGS. 5A and 5C depict the robot device 112 aligning substrate 150 supported by the end effector 130 with the slot 174 formed in load lock 140. This process is similar to the process described above relative to FIGS. 4A to 4C shown in flow chart 1000. The alignment process performed by controller 108 is also displayed in step 1102 of FIG. 11, and is effected by displacement of the robot (e.g. a translation device) by the relative translational motions of the robot device 112. At this point, the controller 108 in FIG. 1 can derive the position of the substrate 150a relative to the slot 174. The substrate 150a is preferably repositioned to the right as depicted in FIG. 5C to center substrate 150a in front of the slot 174 in load lock 140.

In FIG. 5D, the substrate is extended by robot device 112 along direction indicted by arrow 520 until substrate 150a passes through slot 174. FIG. 5D corresponds with step 1104 (FIG. 11) performed by controller at this stage. After the substrate is passed through the slot as shown by step 1106, conveyor or pedestal (not shown, but known in the art) supports substrate 150a either by raising the conveyor or by lowering the end effector 130. At this time, end effector 130 no longer supports the substrate 150a. The end effector 130 can then be removed from the load lock 140 as shown in step 1108 of FIG. 11 as a result of motion of robot assembly 112. This motion is indicated by arrow 561 in FIG. 5E. When the end effector 130 is removed from load lock 140, the substrate 150a remains in the load lock for further processing. The end effector 130 is retracted sufficiently in step 1108 so that the robot device 112 can be transported in front of the load lock 144 without any portion of the end effector 130 or robot device 112 colliding with wall 526.

Figure 11:
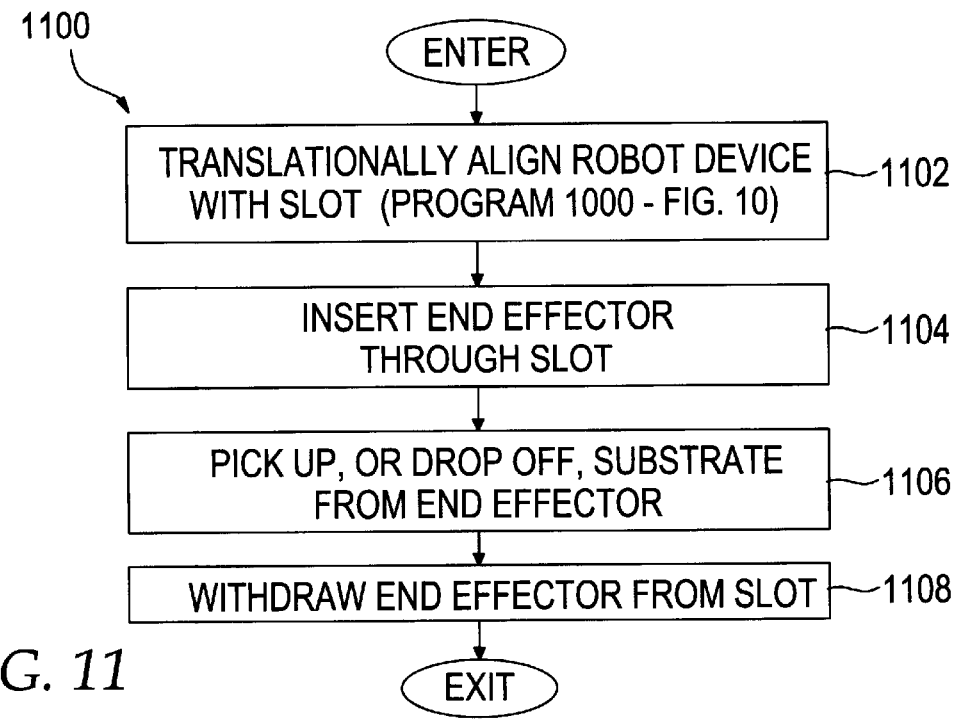
FIG. 11 shows computer software associated with the FIG. 5 robot motion progression of one embodiment of the present invention.

Though program 1100 depicted in FIG. 11 has been described above relating to inserting a substrate 150a into a load lock using robot device 112 as illustrated in FIGS. 5A to 5E, the same program can be used to remove a substrate 150b from a load lock 144 as depicted in FIGS. 5F to 5H. In FIG. 5F, base portion 115 follows direction 530 along robot travel path 110, shown in FIG. 1, until the base portion is centered in front of slot 174 formed in load lock 144.

In FIG. 5G, the substrate 150b supported by end effector 130 is shown as being extended through opening 174 formed in load lock 144. Though FIGS. 5F to 5G do not depict the alignment of the substrate with the slot 174 of load lock 144, this process is performed in a similar manner as described relative to FIGS. 4E to 4H. The controller logic is described in process 1000 as shown in FIG. 10. In actuality, the robot device 112 extends the end effector 130 in a position right of translational position sensor 170*b*; translates the blade assembly to the left until the left elongated support 134 (see FIG. 2) actuates translational position sensor 170*b*; moves the end effector 130 to the right until it is centered in front of slot 174 formed in load lock 144, then the end effector 130 is moved in a direction indicated by arrow 534 until the end effector 130 is inserted into load lock 144.

During the insertion, the substrate 150*b* is positioned on pedestal or conveyor (not shown) to raise the substrate 150*b* at a higher level than the slot (the direction taken as depicted in FIG. 3) so the end effector 130 can slide under the substrate without contacting either. After the insertion of substrate 150b, the pedestal, or conveyor is dropped relative to the end effector 130 (or the end effector 130 is raised relative to the pedestal or conveyor) such that substrate 150*b* is supported directly by end effector 130 as indicated in process 1100 by step 1106. At this point, the substrate is properly aligned on the end effector 130. In FIG. 5H, shown in FIG. 11 as step 1108, the robot device 112 retracts the end effector 130 (along with the supported substrate 150*b*) along a direction indicated by arrow 536. When the robot device 112 is in a position indicated in FIG. 5H, the base 115 can move along robot travel path 110 (see FIG. 1) into cassette loading portion 104, if so desired. During this travel, it is important that the substrate 150*b* be retracted sufficiently to limit contact with walls 526.

Figure 12:
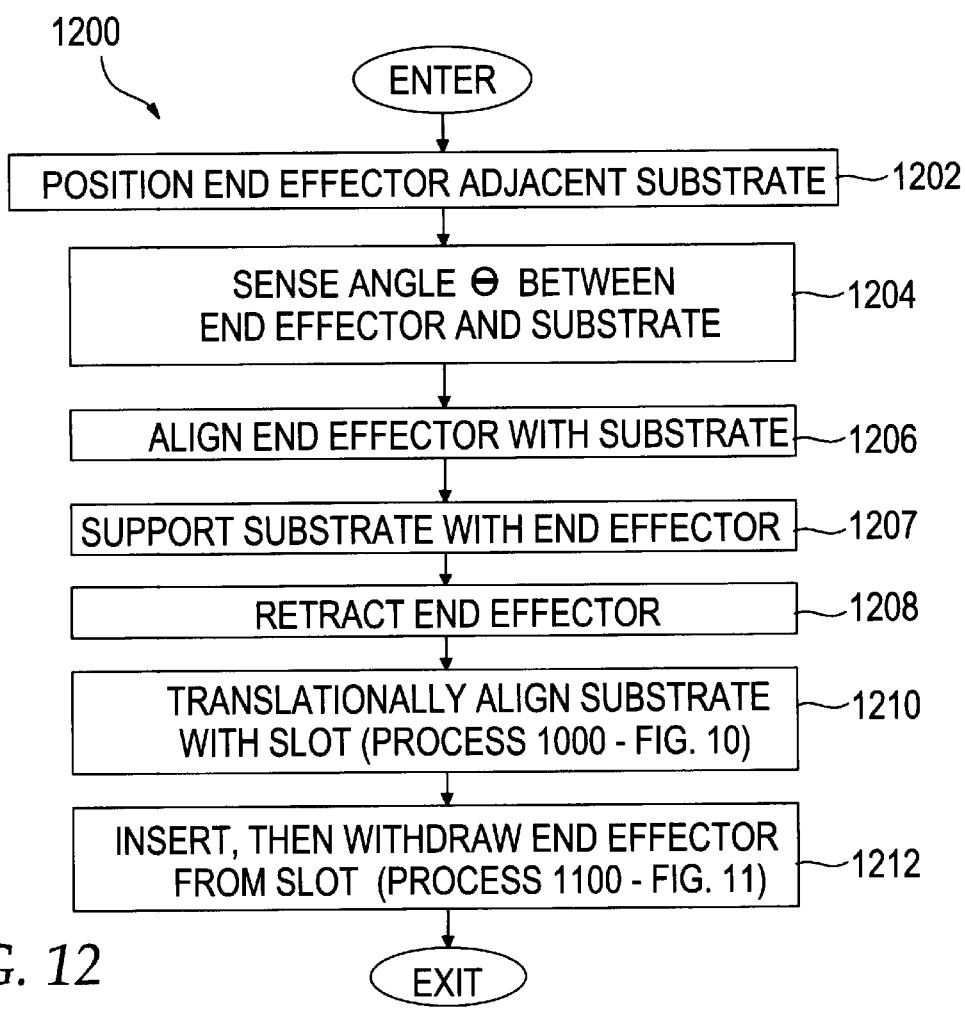
FIG. 12 shows computer software associated with the FIG. 6 robot motion progression of one embodiment of the present invention.
Figure 13:
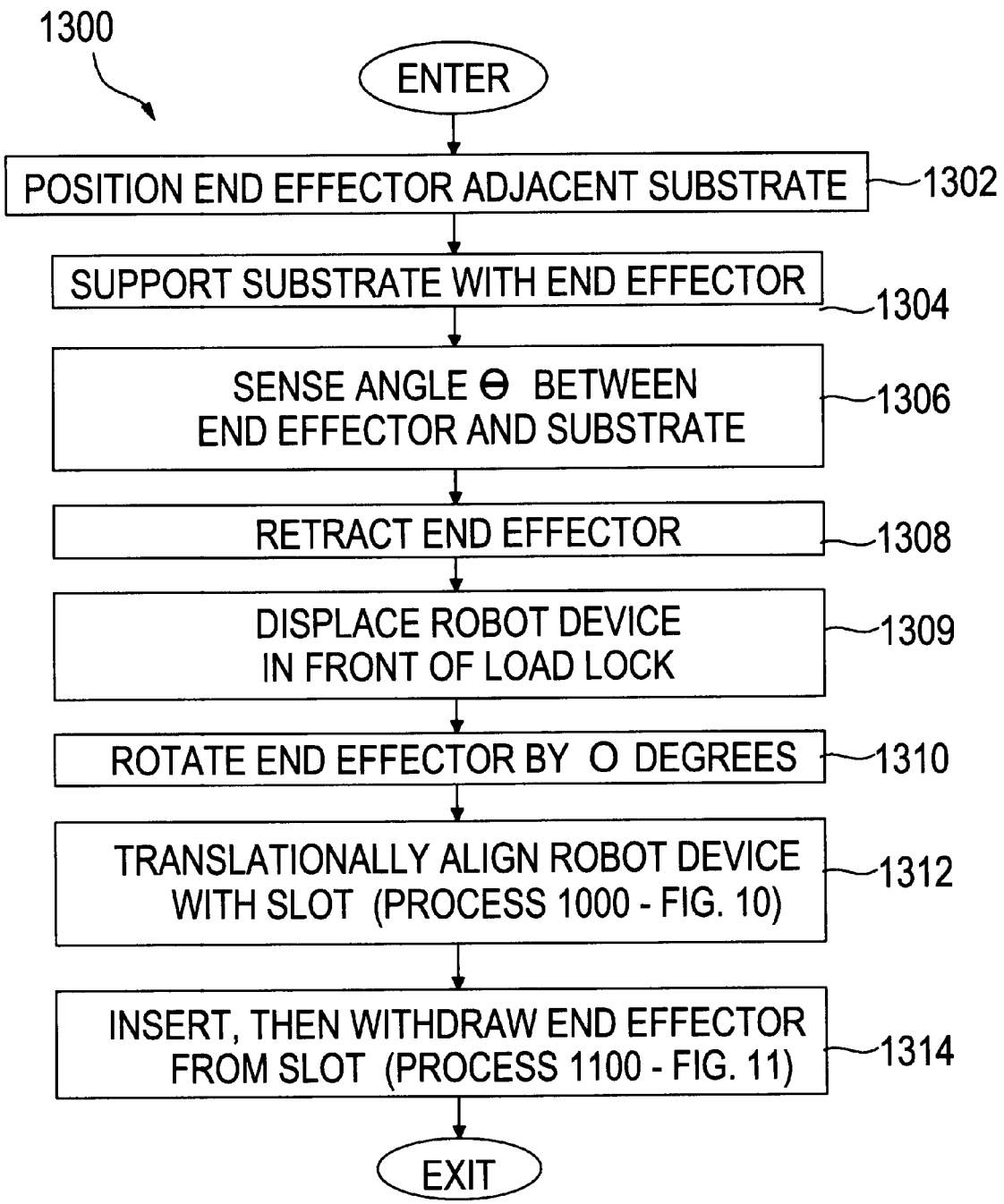
FIG. 13 shows computer software associated with the FIG. 7 robot motion progression of one embodiment of the present invention.

The last two embodiments of robot motion are described relative to FIGS. 6 and 7 (with the program of controller 108 shown in FIGS. 12 and 13, respectively). Each of these two robot motion relate to a problem of inserting a substrate, that is not aligned with the elongated supports 134 of end effector 130, through slot 174 formed in the load lock 140.

Figure 9:
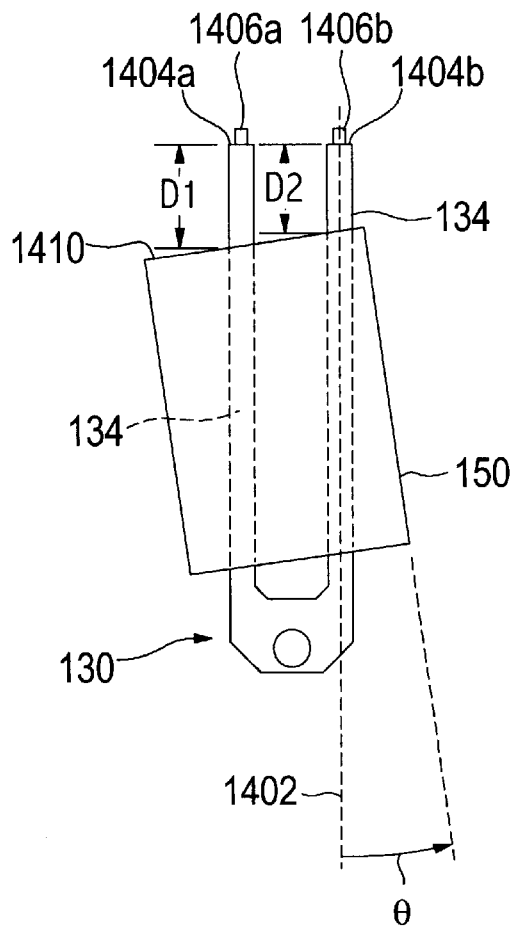
FIG. 9 shows one embodiment of rotational positional sensor located on end effector that is used to sense misalignment between the substrate and the end effector.

An important element in the embodiments of FIGS. 6 and 7 is a rotational position sensor 601 that determines the angle between substrate 150 and the end effector 130. In the embodiment of FIG. 9, substrate 150 is angled relative to axis 1402 of elongated supports 134 of end effector 130 and angle θ. Based upon this geometry, the distances between the ends 1404*a*, 1404*b* of each of the elongated elements 134 and the substrate 150, indicated by distances D1 and D2, differ. Distance sensors 1406*a* and 1406*b* precisely measure distances D1 and D2, and by using the equation $$\frac{D1 - D2}{S} = \text{Sin}\Theta,$$

to determine the angle θ at which the substrate is angled relative to the end effector 130. S is the separation between the two elongated supports 134. Distance sensors 1406*a* and 1406*b* function by transmitting a signal to be reflected off top surface 1410 of substrate, and determine the time necessary for the signal to return. Optical sensors have been found particularly acceptable, but any other suitable sensor (particularly a reflector sensor) may be used.

Figure 14:
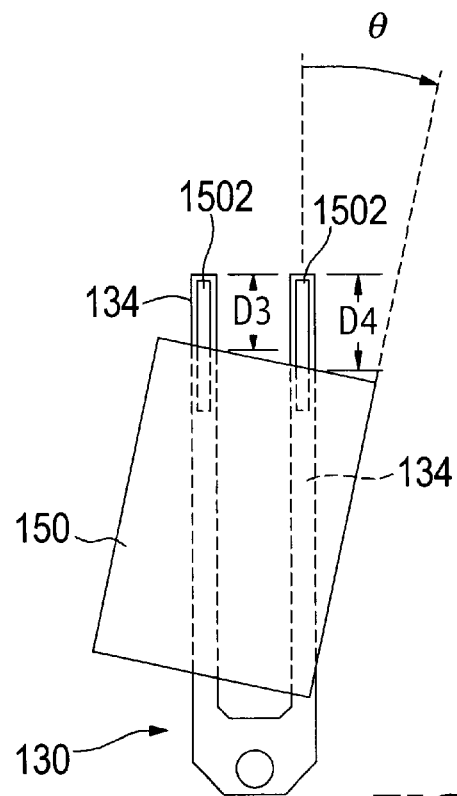
FIG. 14 shows an alternate embodiment of rotational position sensor located on end effector from the embodiment of FIG. 9.

In another embodiment of rotational position sensor, show in FIG. 14, an array proximity sensor 1502 is positioned along each elongated support 134. Each array proximity sensor 1502 determines the respective distances, shown by arrows D3 and D4, that the substrate 150 does not cover up. Using the respective distances D3 and D4, and geometry similar to the embodiment of FIG. 9, the angle θ between the substrate 150 and the end effector 130 can be derived. An advantage of both the embodiments of FIGS. 9 and 14 of rotational position sensor 1406*a*, 1406*b*, and 1502 is that both types of sensors indicate not only the angle of the substrate 150 relative to the end effector 130, but also indicate the presence of substrate 150 on end effector 130. Any other known type of rotational sensor is intended to be within the scope of the present invention.

In a third embodiment of robot motion depicted in FIGS. 6A to 6H (and the process shown in FIG. 12), the end effectors 130 are aligned with the substrate prior to inserting the substrate through the slot. In FIG. 6A, which corresponds to step 1202 of FIG. 12, the end effector 130 is extended by robot device 112 in a direction indicated by arrow 602, such that the end effector 130 is positioned adjacent to the substrate 150. At this stage, the substrate is located inside of, and initially supported by, cassette 156, in a position in which end effectors 130 can initially pass under the substrate. The rotational position sensors 1406*a*, 1406*b*, 1502 of FIGS. 9 and 14, as described above, determine the angle θ at which the substrate is rotated relative to the end effectors 130 in step 1204.

In FIG. 6B, which corresponds to step 1206 of process 1200, the CPU 180 of controller 108 rotates rotational joint 124 (which rotates the end effectors 130 relative to substrate 150). In FIG. 6C, which corresponds to step 1207, either the cassette 150 is retracted or the end effectors are raised, such that the substrate is supported by the end effectors 130. This support continues until the end effector 130 positions the substrate in the load lock.

In FIG. 6D, which corresponds to step 1208, the robot device acts to retract end effectors 130 in a direction indicated by arrow 608 a sufficient distance to permit the base 115 to be transported along robot travel path 110 without the substrate 156 colliding with wall 610. At this point, process 1200 in FIG. 12 continues to step 1210 in which the substrate 150 is translationally aligned with slot 174 in a similar manner as described above by computer process 1000 of FIG. 10. In step 1212, which is not shown in any of the FIGS. included in FIG. 6, substrate 150 is inserted through slot 174 in a similar manner described above relative to process 1100 shown in FIG. 11. In the manner described above relative to FIGS. 6 and 12, the substrate is rotationally aligned with the end effector 130 before the end effector is translationally aligned with, and passed through, slot 174 formed in load lock 140.

In the fourth and final embodiment of robot motion depicted in FIG. 7 (the process shown in FIG. 13), the end effectors 130 are rotated through a negative angle θ, which equals but is opposite to the angle θ that the substrate is angled relative to the end effector 130 as shown in FIGS. 9 and 14. In FIG. 7A, which corresponds to'step 1302 in FIG. 13, the end effectors 130 are displaced in a direction 710 into an opening 712 formed in cassette 156. The precise position between the substrate 150 and the cassette 156 is uncertain at this time since some degree of relative motion therebetween is permitted. As soon as the end effectors 130 are properly positioned under the substrate 150, the robot device 112 raises the end effectors to support the substrate in step 1304 of FIG. 13. In step 1306, the angle 0 between the end effector 134 and the substrate 150 are sensed.

Figure 7A:
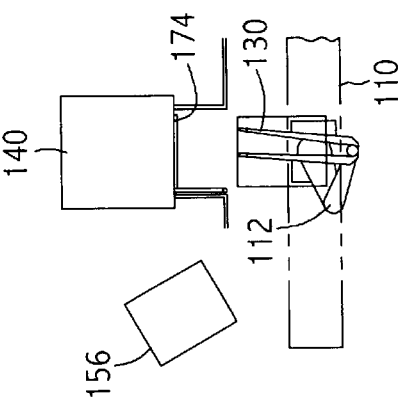
FIGS. 7A to 7G, shows a top schematic diagram of another embodiment of a progression of a top view of robot motion in which the robot device removes a substrate from a cassette and then aligns the substrate to insert it into a load lock.
Figure 7B:
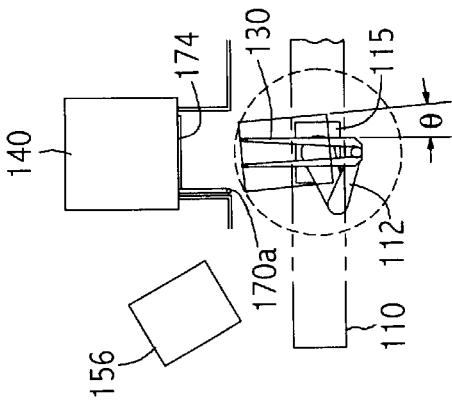
Figure 7C:
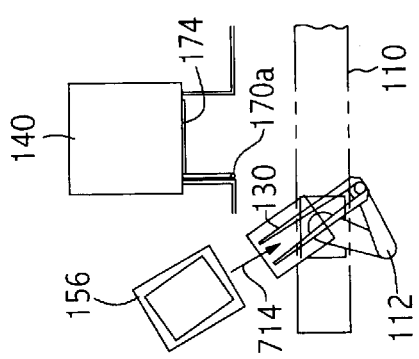

In step 1308 of process 1300, shown physically in FIG. 7B, the end effectors 156 and the remainder of the blade assembly 120 are retracted in a direction as shown by arrow 714. This retraction permits transportation of the robot device 112 and the substrate 150 from the cassette loading portion 104 shown in FIG. 1 to in front of a desire load lock 140. In block 1309, the robot device is displaced along robot travel path 110 until it is positioned in front of slot 174 formed in the load lock 140. Since the width of substrate 150 may be only slightly narrower than the slot 174, if the substrate 150 is attempted to be inserted through the slot 174 with this orientation, a collision would likely occur between the substrate 150 and the slot 174.

Figure 7D:
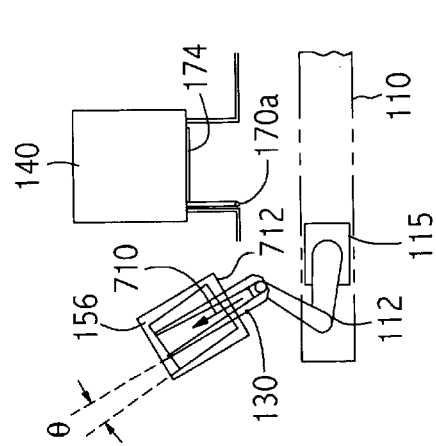
Figure 7E:
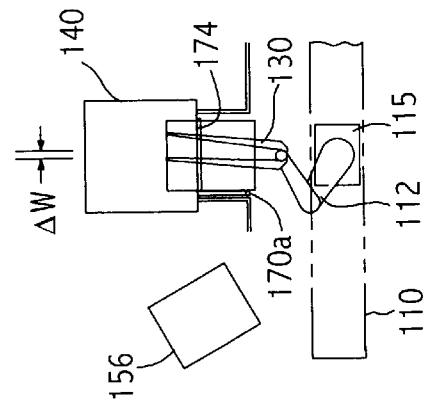
Figure 7F:
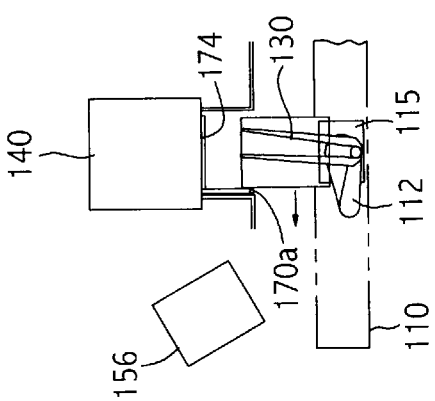
Figure 7G:
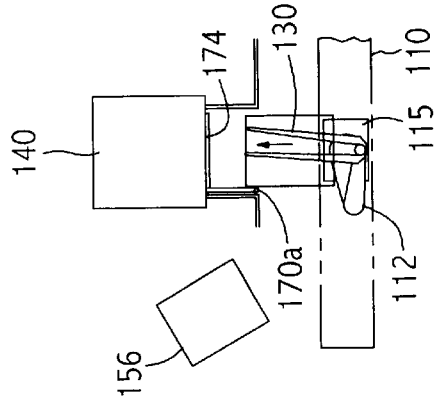

To enable the substrate 150 to fit through slot 174, the substrate is rotated through an angle of negative θ as shown in FIG. 7D and step 1310 in FIG. 13 to align the substrate with the slot 174. This rotation is accomplished by rotating the rotational joint 124 using a rotational device such as a gear drive or motor that provides sufficient motive force causing end effector 130 and substrate 150 to rotate. After this rotational alignment of substrate 150 with slot 174, the substrate 150 is translationally aligned with slot in FIG. 7F, and step 1312 (as described above relative to process 1000 depicted in FIG. 10 and FIGS. 4A to 4D). The end effectors 130 (with the substrate 150 supported thereupon) is then inserted through the slot 174. During this insertion, the end effectors 130 are maintained at the angle of negative θ degrees to minimize contact between the slot and the substrate. This insertion process, along with the subsequent withdrawal of the end effectors 130 is shown in process 1100 of FIG. 11, and described above relative to his process. The negative θ rotation as shown in FIG. 7D an actually occur anywhere from FIGS. 7A to 7E.

Although various embodiments that incorporate the teachings of the present invention have been shown and described in detail herein, those skilled in the art can readily devise many other varied embodiments that still incorporate these teachings.

We claim:

1. An apparatus that aligns an object with a slot, the apparatus comprising a translational position sensor positioned in close proximity to the slot, wherein said translational position sensor determines the position of the object moving relative to the position of the slot.

2. The apparatus set forth in claim 1, wherein the object to be aligned is an end effector.

3. The apparatus set forth in claim 1, wherein the object to be aligned is a substrate.

4. The apparatus set forth in claim 1, wherein the translational position sensor comprises a sensor having a beam that can be broken by the object.

5. The apparatus set forth in claim 1, wherein the object can pass through the slot after it is aligned with the slot, the apparatus further comprising a translation device that passes the object through the slot.

6. The apparatus set forth in claim 1, wherein a stored object configuration is stored in a memory, the stored object configuration is used to determine the position of the object.

7. An apparatus for rotationally aligning an end effector with a substrate, comprising:
the end effector having:
a support device to support the substrate;
an angle-determining device disposed at an end of the support device, the angle-determining device being configured to determine an offset angle of the substrate relative to the end effector; and
a rotational device that rotates the end effector relative to the substrate to compensate for the offset angle.

8. An apparatus for rotationally aligning an end effector with a substrate, comprising:
the end effector having:
a support device to support the substrate;
an angle-determining device disposed at an end of the support device, the angle-determining device being configured to determine an offset angle of the substrate relative to the end effector; and
a rotational device that rotates the end effector relative to the substrate to compensate for the offset angle; and
a translation device that moves the end effector to a position in close proximity to a slot, wherein the translation device moves the end effector in a direction parallel to the width of the slot until a sensor is actuated by the substrate.

9. An apparatus for rotationally aligning an end effector with a substrate, comprising:
the end effector having:
a support device to support the substrate;
an angle-determining device disposed at an end of the support device, the angle-determining device being configured to determine an offset angle of the substrate relative to the end effector; and
a rotational device that rotates the end effector relative to the substrate to compensate for the offset angle; and
a translation device that moves the end effector in a direction through a slot.

10. The apparatus set forth in claim 7, wherein the angle determining device comprises a plurality of array proximity sensors.

11. The apparatus set forth in claim 7, wherein the angle determining device comprises a plurality of distance sensors.

12. An apparatus for rotationally aligning an end effector with a substrate, the apparatus comprising:
the end effector positioned relative to the substrate, the effector having:
an angle-determining device that determines an offset angle of the substrate relative to the end effector;
a support device that supports the substrate with the end effector at the offset angle; and
a rotational device that rotates the end effector relative to the substrate in response to the offset angle.

13. An apparatus for rotationally aligning an end effector with a substrate, the apparatus comprising:
the end effector positioned relative to the substrate, the effector having:
an angle-determining device that determines an offset angle of the substrate relative to the end effector;
a support device that supports the substrate with the end effector at the offset angle; and
a rotational device that rotates the end effector relative to the substrate in response to the offset angle; and
a translation device that translates the end effector into close proximity with a slot, wherein the translation device moves the end effector in a direction parallel to the width of the slot until a sensor is actuated by the substrate.

14. The apparatus set forth in claim 13, wherein the translation device moves the end effector in a direction substantially perpendicular to the slot until the substrate fully passes through the slot.

15. The apparatus set forth in claim 12, wherein the angle determining device comprises a plurality of array proximity sensors.

16. The apparatus set forth in claim 12, wherein the angle determining device comprises a plurality of distance sensors.

17. An apparatus comprising:
a robot device that rotates about a rotational joint, the robot device having an end effector comprising:

a support device to support the substrate;

an angle-determining device disposed at an end of the support device, the angle-determining device is configured to determine an offset angle of the substrate relative to the end effector; and a rotational device that rotates the end effector relative to the substrate to compensate for the offset angle.

18. The apparatus set forth in claim 17, wherein the robot device comprises multiple arms mechanically linked together by rotational joints.

19. The apparatus set forth in claim 17, the robot device further comprising a robot base constrained to follow a robot travel path.

20. A method for aligning an object with a slot, the method comprising:

positioning a translational position sensor a prescribed distance laterally of the slot; and sensing position of the object moving relative to the slot using the translational position sensor.

21. The method set forth in claim 20, wherein the object to be aligned is an end effector.

22. The method set forth in claim 20, wherein the object to be aligned is a substrate.

23. The method set forth in claim 20, wherein the translational position sensor comprises a sensor having a beam that is broken by the object during the sensing position step.

24. The method set forth in claim 20, wherein the object is configured to pass through the slot if it is aligned with the slot, the method further comprising passing the object through the slot.

25. The method set forth in claim 20, wherein a stored object configuration is stored in a memory, the method further utilizes the stored object configuration in the sensing position step.

26. A method for rotationally aligning an end effector with a substrate, the method comprising:

positioning the end effector relative to the substrate;

determining an offset angle of the substrate relative to the end effector;

rotating the end effector relative to the substrate to compensate for the offset angle; and supporting the substrate with the end effector.

27. The method set forth in claim 26, further comprising:

positioning the end effector in close proximity to the slot; and moving the end effector in a direction parallel to the slot until a sensor is actuated by the substrate.

28. A method for rotationally aligning an end effector with a substrate, the method comprising:

positioning the end effector relative to the substrate;

determining an offset angle of the substrate relative to the end effector;

rotating the end effector relative to the substrate to compensate for the offset angle;

supporting the substrate with the end effector; and moving the end effector in a direction substantially perpendicular to the slot until the substrate fully passes through the slot.

29. A method for rotationally aligning an end effector with a substrate, the method comprising:

positioning the end effector relative to the substrate;

thereafter supporting the substrate with the end effector;

thereafter determining an offset angle of the substrate relative to the end effector; and thereafter rotating the end effector relative to the substrate to compensate for the offset angle.

30. The method set forth in claim 29, further comprising:

positioning the end effector in close proximity to the slot; and thereafter moving the end effector in a direction parallel to the width of the slot until a sensor is actuated by the substrate.

31. A method for rotationally aligning an end effector with a substrate, the method comprising:

positioning the end effector relative to the substrate;

thereafter supporting the substrate with the end effector;

thereafter determining an offset angle of the substrate relative to the end effector;

thereafter rotating the end effector relative to the substrate to compensate for the offset angle; and moving the end effector in a direction substantially perpendicular to the slot until the substrate fully passes through the slot.

32. The apparatus of claim 1, wherein the translational position sensor comprises a beam transmitter configured to transmit a vertically directed beam; and a beam receiver configured to receive the vertically directed beam.

33. The apparatus of claim 32, wherein the beam transmitter is disposed above the slot and the beam receiver is disposed below the slot such that the beam transmitter and the beam receiver are aligned with one of a left side and a right side of the slot.

34. The apparatus of claim 33, wherein the vertically directed beam is broken by the object when the object is aligned with one of the left side and the right side of the slot.

35. An apparatus comprising:

a robot device that rotates about a rotational joint, the robot device having an end effector, and the robot device being configured to align the end effector with a substrate both in instances where the substrate is aligned with the rotational joint and in instances where the substrate is not aligned with the rotational joint; and a translational position sensor positioned in close proximity to a slot, the translational positioned sensor being configured to align the substrate with the slot.

* * * * *

UNITED STATES PATENT AND TRADEMARK OFFICE
CERTIFICATE OF CORRECTION

PATENT NO.       : 6,577,923 B1
APPLICATION NO.  : 09/470821
DATED            : June 10, 2003
INVENTOR(S)      : White et al.

It is certified that error appears in the above-identified patent and that said Letters Patent is hereby corrected as shown below:

On Title Page, Item (56) Col. 1
Please insert U.S. Patent Documents
5,537,311 A    7/1996    Stevens .....................364/167.01
5,690,744 A    11/1997   Landau .....................118/715
5,917,601 A    6/1999    Shimazaki, et al. .......356/375

Column 1
Line 63, please change "plat-panel" to -- flat panel --

Column 12
Line 51, please change "to'step" to -- to step --.
Line 59, please change "0" to -- θ --.

Signed and Sealed this

Twenty-ninth Day of August, 2006

JON W. DUDAS
*Director of the United States Patent and Trademark Office*